(12) United States Patent
Velazquez et al.

(10) Patent No.: US 11,710,648 B2
(45) Date of Patent: Jul. 25, 2023

(54) DRYING ENVIRONMENTS FOR REDUCING SUBSTRATE DEFECTS

(71) Applicant: Applied Materials, Inc., Santa Clara, CA (US)

(72) Inventors: Edwin Velazquez, Union City, CA (US); Jim Kellogg Atkinson, Los Gatos, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/878,907

(22) Filed: Aug. 2, 2022

(65) Prior Publication Data
US 2022/0375769 A1 Nov. 24, 2022

Related U.S. Application Data

(62) Division of application No. 16/423,661, filed on May 28, 2019, now Pat. No. 11,430,672.
(Continued)

(51) Int. Cl.
*H01L 21/67* (2006.01)
*H01L 21/687* (2006.01)
*H01L 21/677* (2006.01)

(52) U.S. Cl.
CPC .. *H01L 21/67034* (2013.01); *H01L 21/67051* (2013.01); *H01L 21/67772* (2013.01); *H01L 21/68764* (2013.01)

(58) Field of Classification Search
CPC ......... H01L 21/67034; H01L 21/67051; H01L 21/67772; H01L 21/68764; B08B 3/02; B08B 3/04; B08B 3/102
See application file for complete search history.

(56) References Cited

U.S. PATENT DOCUMENTS 5,052,126 A * 10/1991 Moe .................. H01L 21/67034
 34/73
5,425,793 A * 6/1995 Mori .................. B01D 46/0013
 55/385.2
(Continued)

FOREIGN PATENT DOCUMENTS

JP H04-186623 A 7/1992
JP 2000-306881 A 11/2000
(Continued)

OTHER PUBLICATIONS

International Search Report dated Jul. 8, 2020 for Application No. PCT/US2020/019521.
(Continued)

*Primary Examiner* — David J Laux
*Assistant Examiner* — Bao D Nguyen
(74) *Attorney, Agent, or Firm* — Patterson & Sheridan, LLP

(57) ABSTRACT

One or more embodiments described herein generally relate to drying environments within semiconductor processing systems. In these embodiments, substrates are cleaned and dried within a drying environment before returning to the factory interface. However, due to an opening between the factory interface and the drying environment, air flows from the factory interface into the drying environment, often reducing the effectiveness of the drying processes. In embodiments described herein, the air flow is blocked by a sliding door that raises up to the closed position when a substrate enters the drying portion of the dryer located within the drying environment. After the substrate exits the dryer and before the substrate enters the factory interface, the sliding door lowers to the opened position such that the substrate can enter the factory interface. As such, these
(Continued)

processes allow for multiple substrates to dry quickly and consistently within the system, improving throughput.

20 Claims, 9 Drawing Sheets

Related U.S. Application Data

(60) Provisional application No. 62/813,658, filed on Mar. 4, 2019.

(56) References Cited

U.S. PATENT DOCUMENTS

| | | | | |
|---|---|---|---|---|
| 5,464,580 | A * | 11/1995 | Popescu | B65B 55/18 422/1 |
| 5,624,255 | A * | 4/1997 | Hisada | C21D 9/0018 432/198 |
| 5,671,764 | A * | 9/1997 | Murakami | H01L 21/67051 134/902 |
| 6,269,511 | B1 * | 8/2001 | Andreas | B08B 1/02 134/902 |
| 6,955,516 | B2 * | 10/2005 | Achkire | H01L 21/67034 414/217 |
| 7,513,062 | B2 * | 4/2009 | Achkire | H01L 21/02052 134/32 |
| 7,718,011 | B2 * | 5/2010 | Fishkin | H01L 21/67028 134/1 |
| 7,980,255 | B2 * | 7/2011 | Achkire | H01L 21/68764 414/217 |
| 8,308,529 | B2 * | 11/2012 | D'Ambra | B24B 27/0076 451/287 |
| 8,322,045 | B2 * | 12/2012 | Stein | H01L 21/67034 34/107 |
| 8,869,422 | B2 | 10/2014 | Velazquez et al. | |
| 9,728,428 | B2 | 8/2017 | Brown | |
| 9,984,867 | B2 * | 5/2018 | Mikhaylichenko | H01L 21/67736 |
| 9,997,384 | B2 * | 6/2018 | Ku | H01L 21/67201 |
| 2001/0026747 | A1 * | 10/2001 | Saga | H01L 21/67772 414/200 |
| 2002/0028399 | A1 * | 3/2002 | Nakasuji | H01L 21/6719 430/30 |
| 2002/0124906 | A1 * | 9/2002 | Suzuki | H01L 21/67366 141/98 |
| 2003/0121170 | A1 * | 7/2003 | Achkire | H01L 21/67034 34/107 |
| 2004/0200415 | A1 * | 10/2004 | Maegawa | H01L 21/67028 118/719 |
| 2005/0103270 | A1 * | 5/2005 | Yoshida | H01L 21/67772 118/718 |
| 2005/0229426 | A1 * | 10/2005 | Achkire | H01L 21/02052 257/E21.228 |
| 2005/0241684 | A1 * | 11/2005 | Achkire | H01L 21/67034 134/103.2 |
| 2006/0003570 | A1 * | 1/2006 | Shanmugasundram | H01L 21/02068 257/E21.174 |
| 2006/0156979 | A1 * | 7/2006 | Thakur | C23C 16/45546 438/476 |
| 2006/0174921 | A1 * | 8/2006 | Achkire | H01L 21/681 134/34 |
| 2007/0295371 | A1 * | 12/2007 | Achkire | B08B 3/10 134/61 |
| 2008/0019807 | A1 * | 1/2008 | Suzuki | H01L 21/6719 414/217 |
| 2009/0139548 | A1 * | 6/2009 | Kim | H01L 21/67754 134/26 |
| 2009/0241996 | A1 * | 10/2009 | Achkire | H01L 21/67751 134/30 |
| 2010/0006124 | A1 * | 1/2010 | Achkire | H01L 21/67034 134/25.4 |
| 2016/0260628 | A1 * | 9/2016 | Ochiai | H01L 21/67369 |
| 2017/0323810 | A1 | 11/2017 | Brown | |

FOREIGN PATENT DOCUMENTS

| | | |
|---|---|---|
| JP | 2005-534162 A | 11/2005 |
| KR | 2016-0114945 A | 10/2016 |

OTHER PUBLICATIONS

JP Notice of Reasons for Rejection dated Jan. 15, 2023 for Application No. 2021-552550 (with English Translation).

* cited by examiner

DRYING ENVIRONMENTS FOR REDUCING SUBSTRATE DEFECTS

CROSS-REFERENCE TO RELATED APPLICATIONS

This application is a divisional of co-pending U.S. patent application Ser. No. 16/423,661, filed May 28, 2019, which claims benefit of U.S. provisional Patent Application No. 62/813,658, filed Mar. 4, 2019, which is herein incorporated by reference in its entirety.

BACKGROUND

Field

One or more embodiments described herein generally relate to semiconductor processing systems, and more particularly, to drying environments within semiconductor processing systems.

Description of the Related Art

As semiconductor device geometries continue to decrease, the importance of ultra clean processing increases. Aqueous cleaning within a tank of fluid (or a bath) followed by a rinsing bath (e.g., within a separate tank, or by replacing the cleaning tank fluid) may be employed. After removal from the rinsing bath, absent use of a drying apparatus, bath fluid may evaporate from the substrate's surface and cause streaking, spotting, and/or leave bath residue on the surface of the substrate. Such streaking, spotting, and residue can cause subsequent device failure. Accordingly, much attention has been directed to improved methods for drying a substrate as it is removed from an aqueous bath.

A method known as Marangoni drying creates a surface tension gradient to induce bath fluid to flow from the substrate in a manner that leaves the substrate virtually free of bath fluid, and thus may avoid streaking, spotting, and residue marks. Specifically, during Marangoni drying a solvent miscible with the bath fluid (e.g., isopropyl alcohol (IPA) vapor) is introduced to a fluid meniscus which forms as the substrate is lifted from the bath or as the bath fluid is drained past the substrate. The solvent vapor is absorbed along the surface of the fluid, with the concentration of the absorbed vapor causing the surface tension to be lower at the tip of the meniscus than in the bulk of the bath fluid, causing bath fluid to flow from the drying meniscus toward the bulk bath fluid. Such a flow is known as "Marangoni flow", and can be employed to achieve substrate drying with reducing streaks, spotting, or bath residue on the substrate.

However, achieving uniform Marangoni drying of a substrate can be difficult partially due to air flowing from the factory interface into the dryer. Conventional approaches have an open access between the factory interface and the substrate process environment. In many cases, the factory interface has to operate at higher pressures that lead to high air flow. The high air flow goes directly over the substrate as it is being dried, contributing to substrate defects.

Accordingly, there is a need for drying environments that result in fewer substrate defects.

SUMMARY

One or more embodiments herein relate to drying environments within semiconductor processing systems.

In one embodiment, a drying environment includes a dryer comprising a lid having a first dryer opening and a second dryer opening, wherein the lid is configured to receive at least one substrate into the dryer through the first dryer opening and to allow the at least one substrate to exit the dryer through the second dryer opening; a top portion located above the dryer within the drying environment, the top portion having a drying environment opening between the drying environment and a factory interface; at least one sliding door having a length and a width, the at least one sliding door positioned within the drying environment, wherein the at least one sliding door is configured to move upwards to a position such that the length of the at least one sliding door covers the entirety of the drying environment opening and is configured to move downwards to a position such that the length of the at least one sliding door is entirely below the drying environment opening while the at least one substrate is within the drying environment; and a rotation platform within the top portion, wherein the rotation platform is configured to transfer the at least one substrate to the factory interface through the dryer environment opening.

In another embodiment, a drying environment includes a dryer, comprising: a lid having a first dryer opening and a second dryer opening, wherein the lid is configured to receive at least one substrate into the dryer through the first dryer opening and allow the at least one substrate to exit the dryer through the second dryer opening; a rinsing portion having a tube of liquid; and a drying portion having a plurality of spray bars located directly above the tube of liquid; a top portion located above the dryer within the drying environment, the top portion having a drying environment opening between the drying environment and a factory interface; a sliding door having a length and a width positioned within the drying environment, wherein: the sliding door is positioned such that at least a portion of the length is below the drying environment opening while the at least one substrate is below the plurality of spray bars; and the sliding door is positioned such that the length of the sliding door covers the entirety of the drying environment opening while the at least one substrate is raised past the plurality of spray bars; a rotation platform within the top portion, wherein the rotation platform is configured to transfer the at least one substrate to the factory interface through the dryer environment opening.

One or more embodiments herein also relate to methods for drying substrates.

In one embodiment, a method for drying substrates includes transferring a first substrate into a dryer through a first dryer opening while a sliding door, having a length and a width, is positioned within a drying environment such that the entire length of the sliding door is below a drying environment opening, wherein the dryer is located within the drying environment and the drying environment opening is between the drying environment and a factory interface; raising the sliding door to a position such that the length of the sliding door partially covers the drying environment opening while the first substrate is transferred to position directly below a plurality of spray bars located within the dryer; drying the first substrate by raising the first substrate past the plurality of spray bars and out of the dryer through a second dryer opening while the sliding door is in the position such that the entire length of the sliding door covers the drying environment opening; lowering the sliding door to a position such that the length of the sliding door partially covers the drying environment opening while the first substrate is loaded onto a rotation platform within the drying environment; and transferring the first substrate to the factory interface through the drying environment opening while the sliding door is in the position such that the entire length of the sliding door is below the drying environment opening and simultaneously transferring a second substrate into the dryer through the first dryer opening.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

In the following description, numerous specific details are set forth to provide a more thorough understanding of the embodiments of the present disclosure. However, it will be apparent to one of skill in the art that one or more of the embodiments of the present disclosure may be practiced without one or more of these specific details. In other instances, well-known features have not been described in order to avoid obscuring one or more of the embodiments of the present disclosure.

One or more embodiments described herein generally relate to drying environments within semiconductor processing systems. In these embodiments, substrates leave a factory interface where materials are then deposited on the surfaces of the substrates, forming semiconductor devices. After materials are deposited on the surfaces of the substrates, the substrates are cleaned and dried within a drying environment before returning to the factory interface. As discussed above, the drying processes and drying environments are important to semiconductor device performance. In these embodiments, Marangoni dryers are used to dry the substrates to help reduce the negative effects of streaking, spotting, and bath residue forming on the surface of the substrate. However, due to an opening between the factory interface and the drying environment, air flow from the factory interface into the drying environment often reduces the effectiveness of the drying processes. Air flow from the factory interface goes directly over the substrate as it is being dried, resulting in substrate defects that reduce semiconductor device performance.

In embodiments described herein, the opening between the factory interface and the drying environment is blocked, blocking the air flow from the factory interface from entering the drying environment when substrates are being dried. The air flow is blocked by a sliding door that raises up to a closed position when a substrate enters the drying portion of the dryer located within the drying environment. Blocking the air from flowing into the drying environment advantageously reduces substrate defects, improving semiconductor device performance. After the substrate exits the dryer and before the substrate enters the factory interface, the sliding door lowers to an opened position such that the substrate can enter the factory interface. While the substrate is entering the factory interface and the sliding door is in the opened position, another substrate can enter the drying environment. The process can be repeated in a synchronous manner such that the sliding door is closed when a substrate is drying but is opened when a substrate is entering the factory interface and another substrate is simultaneously entering the drying environment. As such, these processes allow for multiple substrates to dry quickly and consistently within the system, improving throughout and reducing costs.

Figure 1:
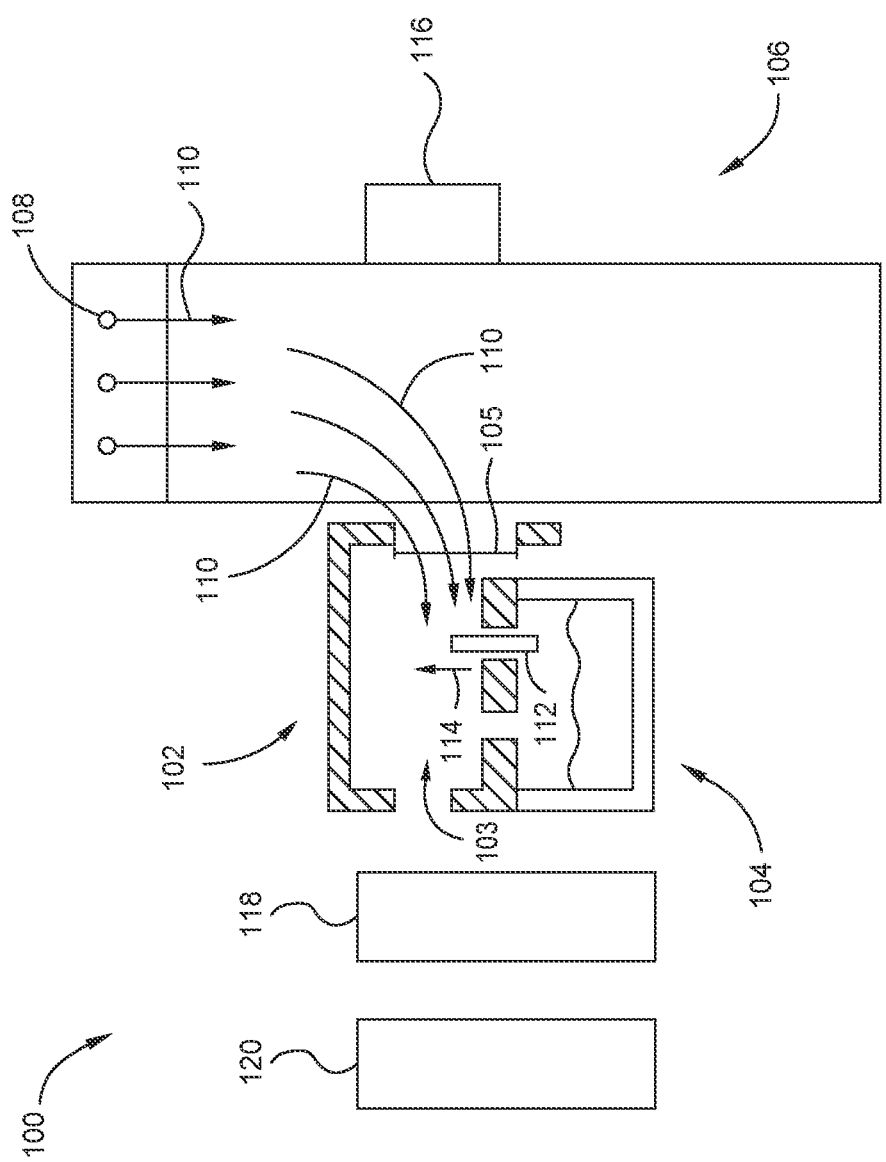
FIG. 1 is a schematic view of a system according to the prior art.

FIG. 1 is a schematic view of a system 100 according to the prior art. The system 100 includes a drying environment 102 and a factory interface 106. Substrates are often stored within a cassette 116 located next to the factory interface 106. Thereafter, the substrates are transferred to the factory interface 106 and then to the processing areas of the system 100 where materials are deposited on the surfaces of the substrates, forming semiconductor devices. Before the semiconductor process is complete, substrates are often transferred to a spray jet module 118 and a brush box module 120, where they are cleaned. Following cleaning, the substrates are transferred into a drying environment 102. The drying environment 102 includes a top portion 103 and a dryer 104. The dryer 104 can be a Marangoni dryer. As discussed above, Marangoni dryers are used to create "Marangoni flow" to dry the substrates, helping reduce the negative effects of streaking, spotting, and bath residue forming on the surface of the substrate. While the substrates, such as substrate 112, are drying in a Marangoni dryer, they are raised out of the dryer 104 and into the top portion 103 of the drying environment 102, as shown by arrow 114, which will be described in more detail below.

In conventional embodiments, air flowing from fans 108 travels from the factory interface 106 through a drying environment opening 105 into the top portion 103 of the drying environment 102 as shown by the arrows 110. The air flowing into the drying environment 102 goes directly over the substrate 112 while it is drying, reducing the effectiveness of the drying process. The substrate 112 often contains defects after the drying process due to the air flow, reducing semiconductor performance. As such, the configuration shown in FIG. 1 is often problematic and needs improvement.

Figure 2:
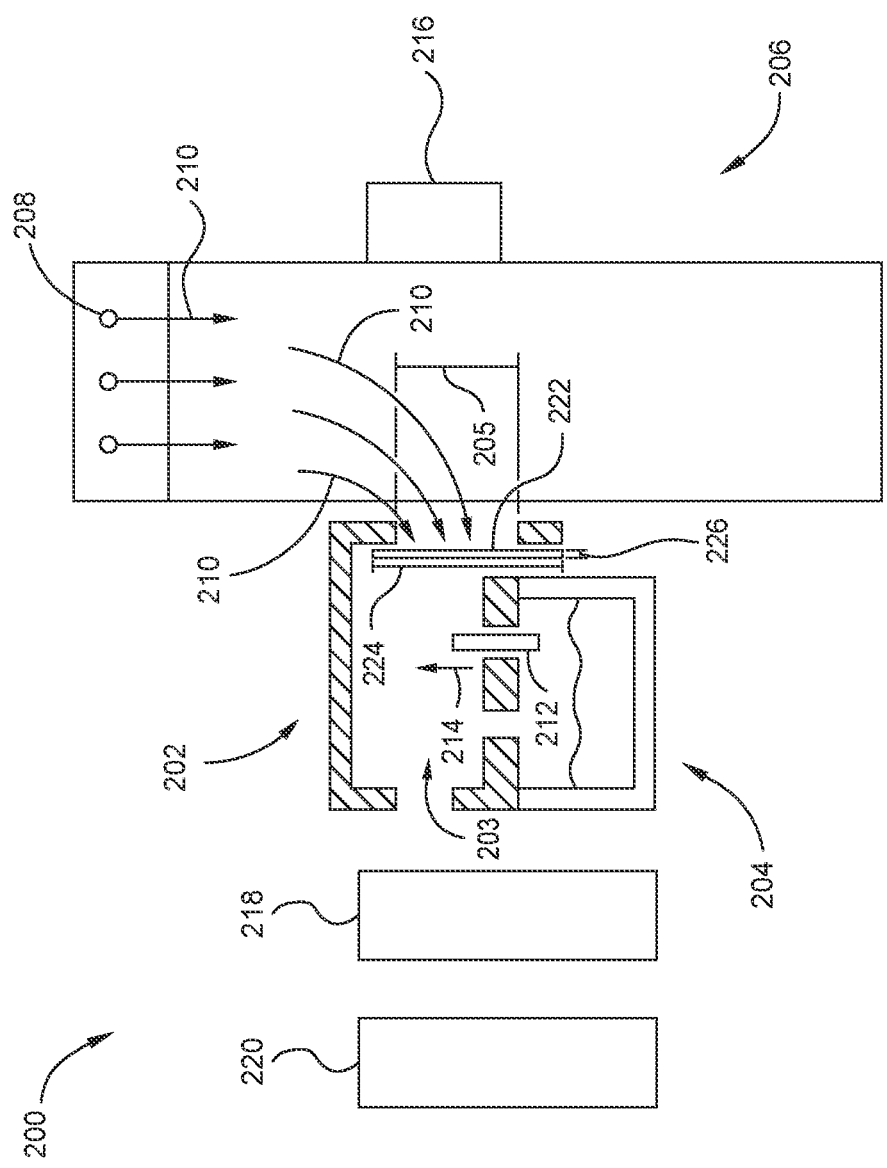
FIG. 2 is a schematic view of a system according to at least one embodiment described herein.

FIG. 2 is a schematic view of a system 200 according to at least one embodiment described herein. In these embodiments, the system 200 includes a drying environment 202 and a factory interface 206. Substrates are often stored within a cassette 216 located next to the factory interface 206. Thereafter, the substrates are transferred to the factory interface 206 and then to the processing areas of the system 200 where materials are deposited on the surfaces of the substrates, forming semiconductor devices. Before the semiconductor process is complete, substrates are often transferred to a spray jet module 218 and a brush box module 220, where they are cleaned. Following cleaning, the substrates are transferred into a drying environment 202. The drying environment 202 includes a top portion 203 and a dryer 204. The dryer 204 can be a Marangoni dryer. As discussed above, Marangoni dryers are used to create "Marangoni flow" to dry the substrates, helping reduce the negative effects of streaking, spotting, and bath residue forming on the surface of the substrate. While the substrates, such as substrate 212, are drying in a Marangoni dryer, they are raised out of the dryer 204 and into the top portion 203 of the drying environment 202, as shown by arrow 214, which will be described in more detail below.

Much like in the conventional embodiments shown in FIG. 1, air flowing from fans 208 travels through the factory interface 206 into the drying environment opening 205 as shown by the arrows 210. However, unlike the conventional embodiments, embodiments described herein include a sliding door 222. The sliding door 222 has a length 224 and a width 226. In these embodiments, the length 224 is greater than the width 226. The sliding door 222 acts to block the air flow from entering the top portion 203 of the drying environment 202 when the sliding door 222 is raised to the closed position, as shown in FIG. 2. The closed position of the sliding door 222 is such that the length 224 of the sliding door 222 extends over the entire drying environment opening 205, completely blocking the air from entering the drying environment 202. Therefore, the air flow from the factory interface 206 stays out of drying environment 202 while the substrate 212 is drying, increasing the effectiveness of the drying process. As such, these embodiments act to reduce defects on the substrate 212 after the drying process is complete, increasing semiconductor performance.

Figure 3:
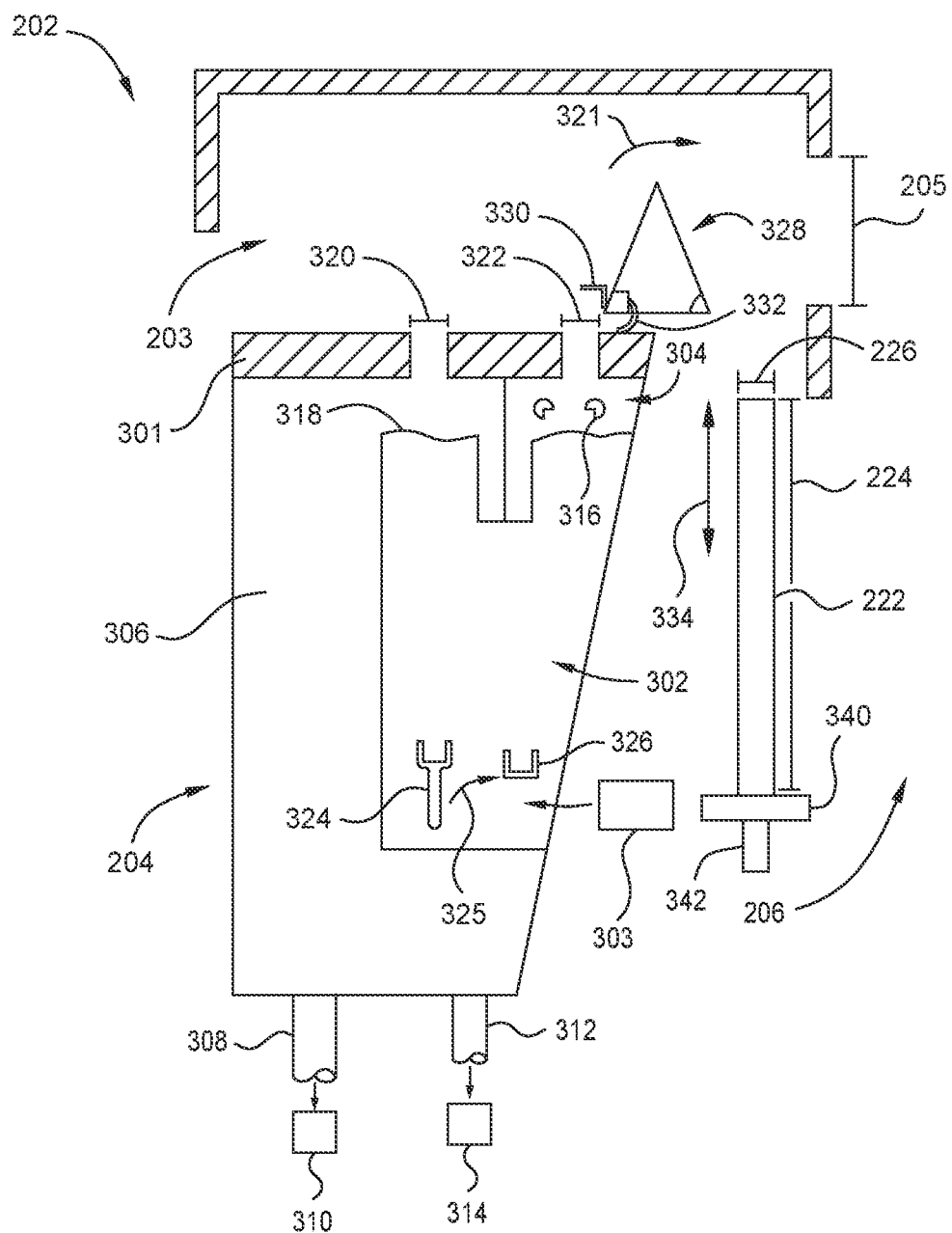
FIG. 3 is a sectional view of a drying environment according to at least one embodiment described herein.

FIG. 3 is a sectional view of a drying environment 202 according to at least one embodiment described herein. In FIG. 3, the drying environment 202 is shown without a substrate present within the drying environment 202. In these embodiments, the drying environment 202 includes the top portion 203 and the dryer 204, as discussed above. The dryer 204 includes a lid 301 having a first dryer opening 320 and a second dryer opening 322. As will be explained in further detail below in FIGS. 4-5E, at least one substrate can enter the dryer 204 through the first dryer opening 320 and exit the dryer 204 through the second dryer opening 322.

In these embodiments, the dryer 204 includes a rinsing portion 302, a drying portion 304, and an overflow weir 306. The rinsing portion 302 includes a liquid 318, such as a bath fluid, which acts to rinse substrates when they enter the dryer 204. A liquid source 303, such as a bath fluid source, acts to supply bath fluid to the rinsing portion 302 of the dryer 204. Within the rinsing portion 302 resides a cradle 324 and a pusher 326. The cradle 324 is configured to receive substrates as they enter the rinsing portion 302. Thereafter, the cradle 324 transfers substrates to the pusher 326 as shown by the arrow 325. The pusher 326 is configured to raise the substrates out of the rinsing portion 302 into the drying portion 304. Within the drying portion 304, just above the surface of the liquid 318, are spray bars 316. The spray bars 316 direct a vapor flow, such an IPA vapor, onto substrates as they are raised out of the liquid 318. The IPA vapor is introduced to a fluid meniscus which forms as the substrate is lifted from the liquid 318 and the liquid 318 is drained from the substrate. The solvent vapor is absorbed along the surface of the liquid 318, with the concentration of the absorbed vapor causing surface tension to be lower at the tip of the meniscus than in the bulk of the liquid 318, causing the liquid 318 to flow from the drying meniscus toward the bulk of the liquid 318. Such a flow is known as "Marangoni flow", and can be employed to achieve substrate drying with reducing streaks, spotting, or bath residue on the substrate.

The overflow weir 306 surrounds the rinsing portion 302 of the dryer such that the fluid 318 may be overflowed thereto. The fluid 318 may be continuously supplied by the fluid source 303 so that fluid continuously overflows to the overflow weir 306. An exhaust port 308 may be coupled to the bottom of the dryer 204 that outputs to an exhaust 310. Additionally, a drain port 312 may be coupled to the bottom of the dryer 204 that outputs to a drain 314, which may act to facilitate drainage of the liquid 318 out of the dryer 204.

In these embodiments, the drying environment 202 also includes a rotation platform 328. The rotation platform 328 is located within the top portion 203 of the drying environment 202. The rotation platform 328 is configured to receive substrates that exit the dryer 204 after exiting the second drying opening 322. Thereafter, the rotation platform 328 acts to rotate as shown by the arrow 321 and transfer substrates out of the drying environment opening 205 into the factory interface 206. The rotation platform 328 includes a catcher 330 and a finger 332. The catcher 330 is configured to receive substrates that exit the dryer 204 after they are raised by the pusher 326. In some embodiments, the catcher 330 may be mounted on a linear ball slide (not shown) that has a stopper at each end. The catcher 330 moves to the bottom of the linear ball slide due to gravity. As substrates exit the drying portion 304 of the dryer 204, the substrates push the catcher 330 and causes the catcher 330 to move upward therewith against gravity. When the catcher 330 reaches its high point, the finger 332 is configured to lock and secure substrates onto the rotation platform 328, as is shown as described in further detail in FIGS. 4-5E.

Additionally, the drying environment 202 includes the sliding door 222, as described above. Although one sliding door 222 is shown and described herein, there can be two or more sliding doors 222 in other embodiments. The sliding door 222 is mounted on a mounting arm 340. The mounting arm 340 is mounted to an actuator 342. In these embodiments, the actuator 342 is a pneumatic slide cylinder that acts to raise and lower the sliding door 222 between an open position and a closed position, as shown by the arrow 334 in FIG. 3. In some embodiments, the actuator 342 can be motorized. Additionally, the actuator can include sensors (not shown) that detect the positioning of the sliding door 222 relative to the drying process. When the sliding door 222 is in the opened position, the length 224 of the sliding door 222 is entirely below the drying environment opening 205. When the sliding door 222 is in the closed position, the length 224 of the sliding door 222 covers the entirety of the drying environment opening 205. As described above, the sliding door 222 blocks air flow from the factory interface 206 from entering the drying environment 202 when it is in the closed position, enhancing the drying process of substrates within the drying environment 202, resulting in fewer substrate defects. Additionally, the sliding door 222 also prevents any accidental encroachment of robots within the factory interface 206 during service and maintenance.

Figure 4:
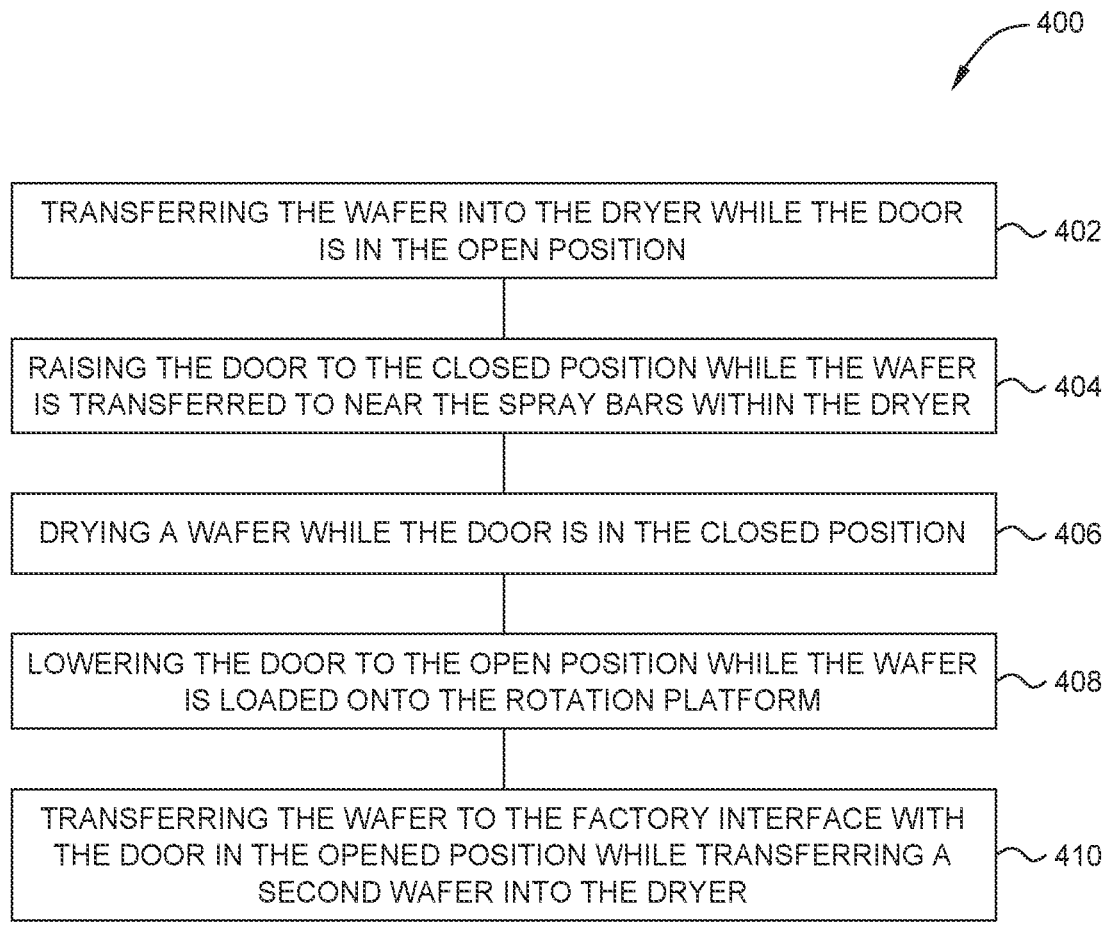
FIG. 4 is a flow chart of a method according to at least one embodiment described herein.

FIG. 4 is a flow chart of a method 400 according to at least one embodiment described herein. In these embodiments, the method 400 is performed with the systems and devices described in FIGS. 1-3, but is not limited to these systems and devices and can be performed with other similar systems and devices. FIGS. 5A-5E show the drying environment 202 at each step of the method 400 described in FIG. 4.

Figure 5A:
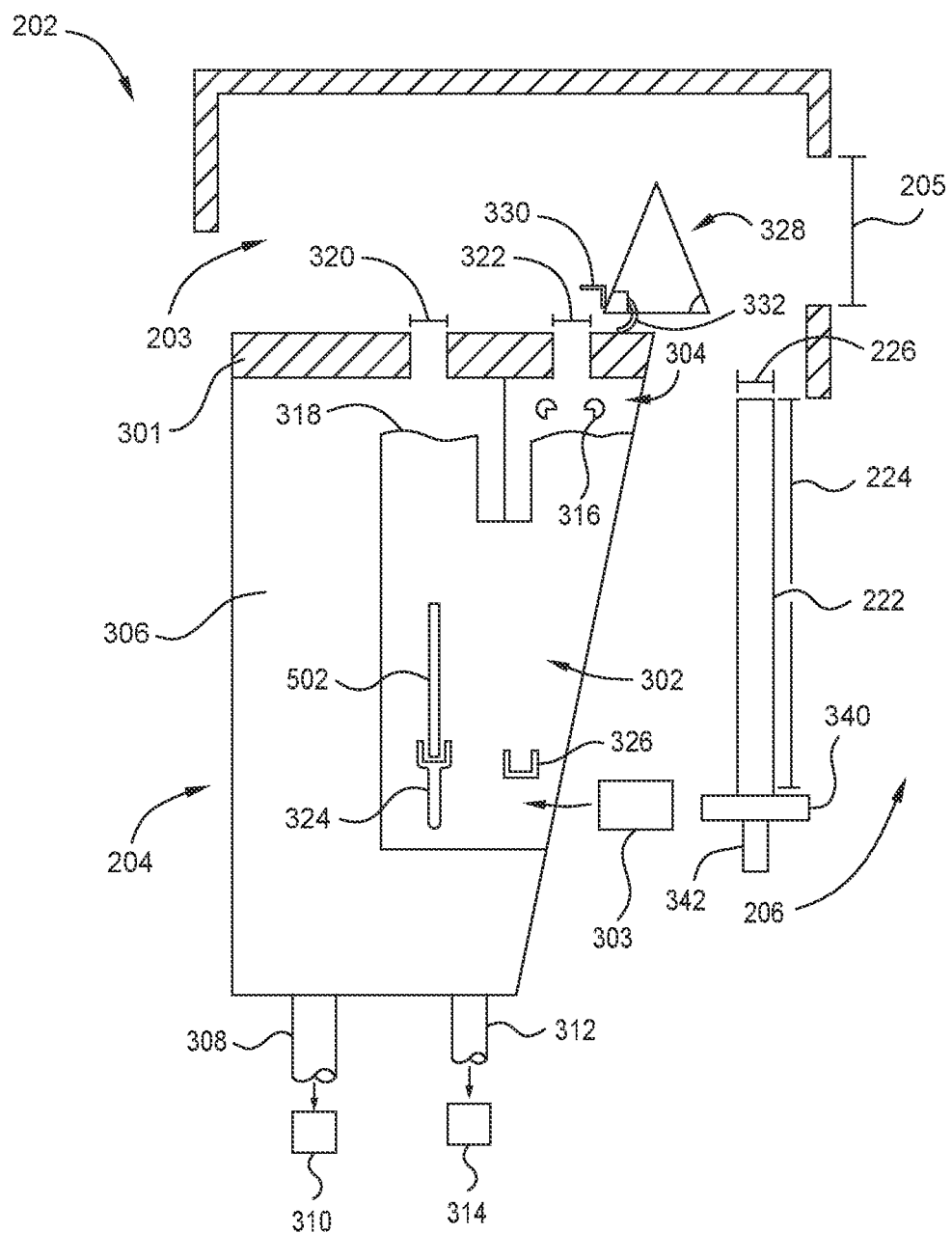
FIGS. 5A-5E show the drying environment at each step of the method described in FIG. 4.

In block 402, a first substrate 502 is transferred into the dryer 204 through the first dryer opening 320 while the length 224 of the sliding door 222 is positioned entirely below the drying environment opening 205, as shown in FIG. 5A. The sliding door 222 in block 402 is in the opened position such that drying environment 202 is exposed to the factory interface 206 through the drying environment opening 205. The cradle 324 receives the first substrate 502 as it enters the rinsing portion 302, as shown in FIG. 5A.

Figure 5B:
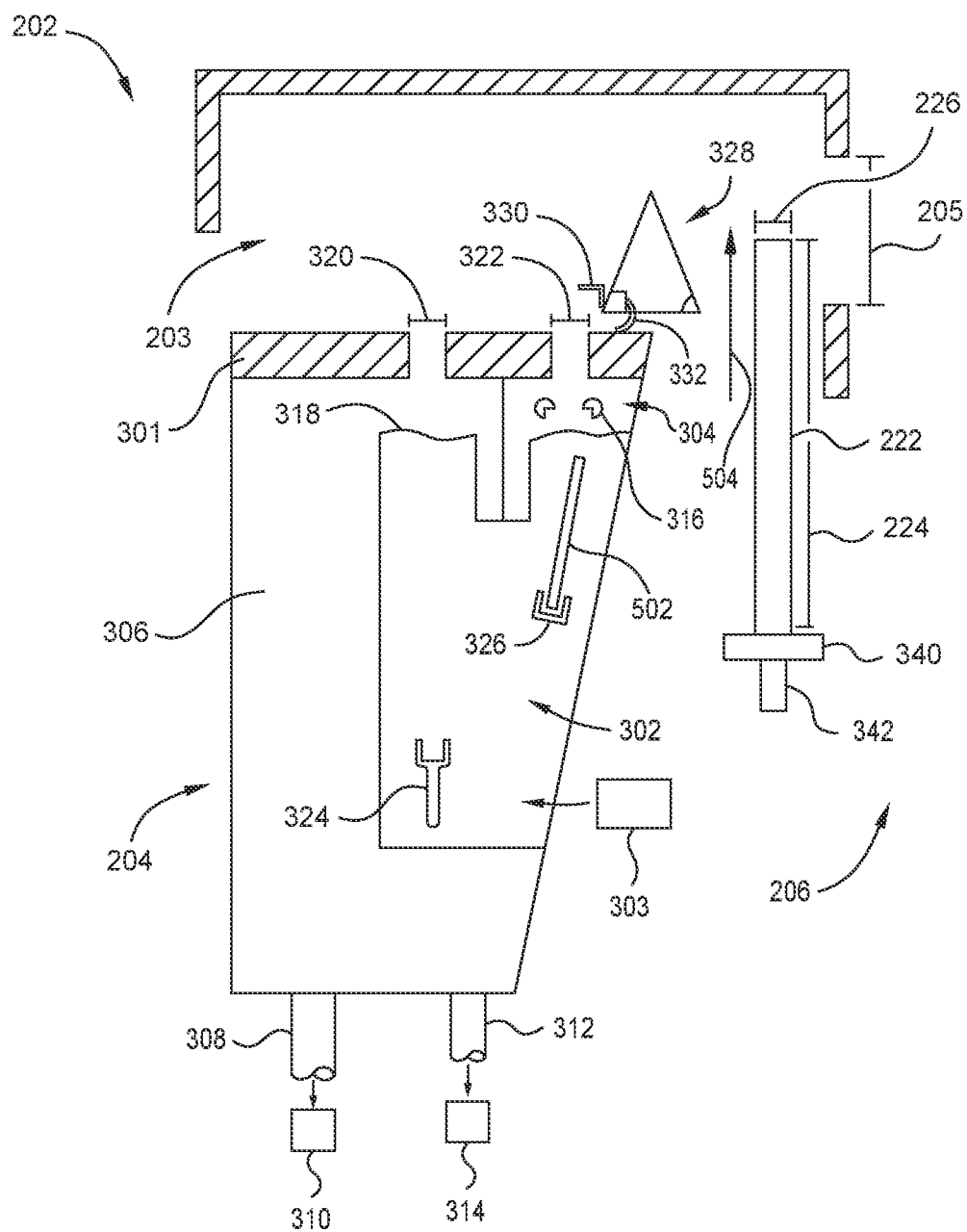

In block 404, the sliding door 222 is raised to a position (as shown by the arrow 504) such that the length 224 of the sliding door 222 partially covers the drying environment opening 205 while the first substrate 502 is transferred to position directly below the plurality of spray bars 316 located within the dryer 204, as shown in FIG. 5B. The first substrate 502 is transferred from the cradle 324 to the pusher 326. The pusher 326 raises the first substrate 502 up to near the surface of the liquid 318 directly below the spray bars 316, as shown in FIG. 5B.

Figure 5C:
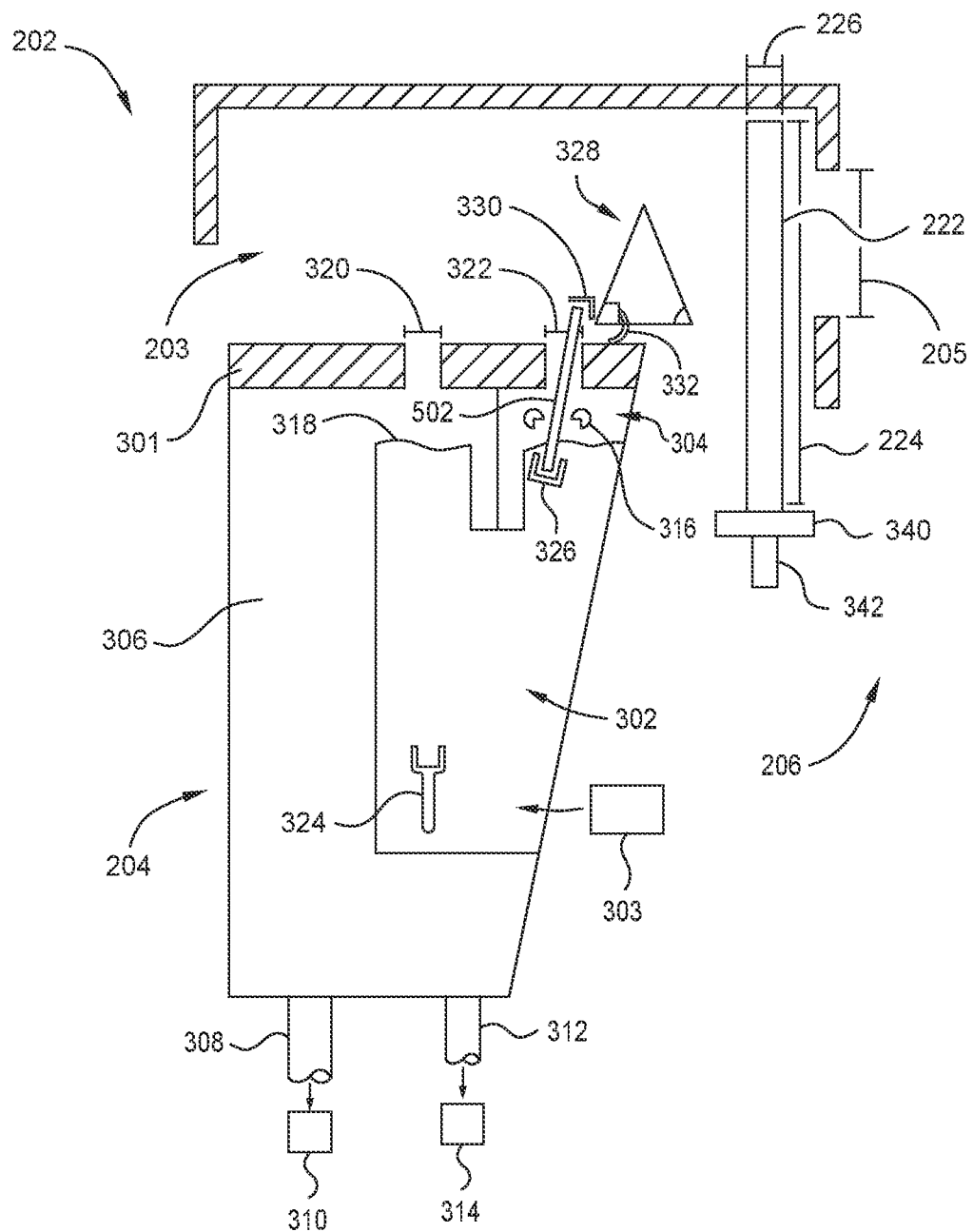

In block 406, the first substrate 502 is dried by raising the first substrate 502 past the plurality of spray bars 316 and out of the dryer 204 through a second dryer opening 322 while the sliding door 222 is in the position such that the entire length 224 of the sliding door 222 covers the drying environment opening 205, as shown in FIG. 5C. The sliding door 222 in block 406 is in the closed position such that air flow from the factory interface 206 flowing into the drying environment opening 205 is blocked from entering the drying environment 202. The first substrate 502 is dried by a Marangoni drying process as it is raised past the spray bars 316, as described above. The pusher 326 continues to raise the first substrate 502 out of the dryer 204 through the second dryer opening 322 such that is engages with the catcher 330 of the rotation platform 328. The catcher 330 is located at the bottom of the rotation platform 328 as it first receives the first substrate 502, as shown in FIG. 5C.

Figure 5D:
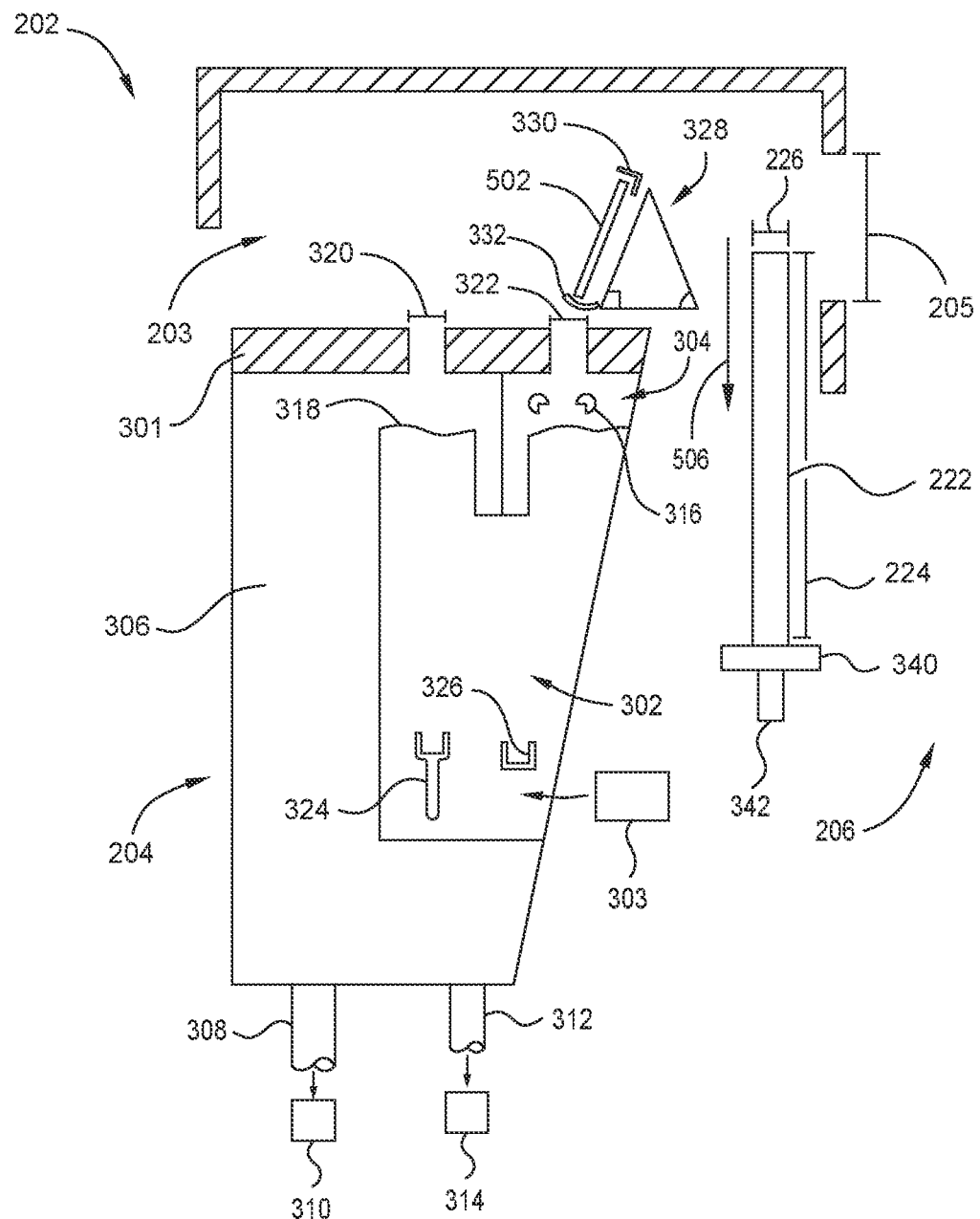

In block 408, the sliding door 222 is lowered to a position (as shown by the arrow 506) such that the length 224 of the sliding door 222 partially covers the drying environment opening 205 while the first substrate 502 is loaded onto the rotation platform 328 within the drying environment 202, as shown in FIG. 5D. The first substrate 502 is raised such that it pushes the catcher 330 and causes the catcher 330 to move upward therewith against gravity. When the catcher 330 reaches its high point, the finger 332 is configured to lock and secure the first substrate 502 onto the rotation platform 328, as shown in FIG. 5D.

Figure 5E:
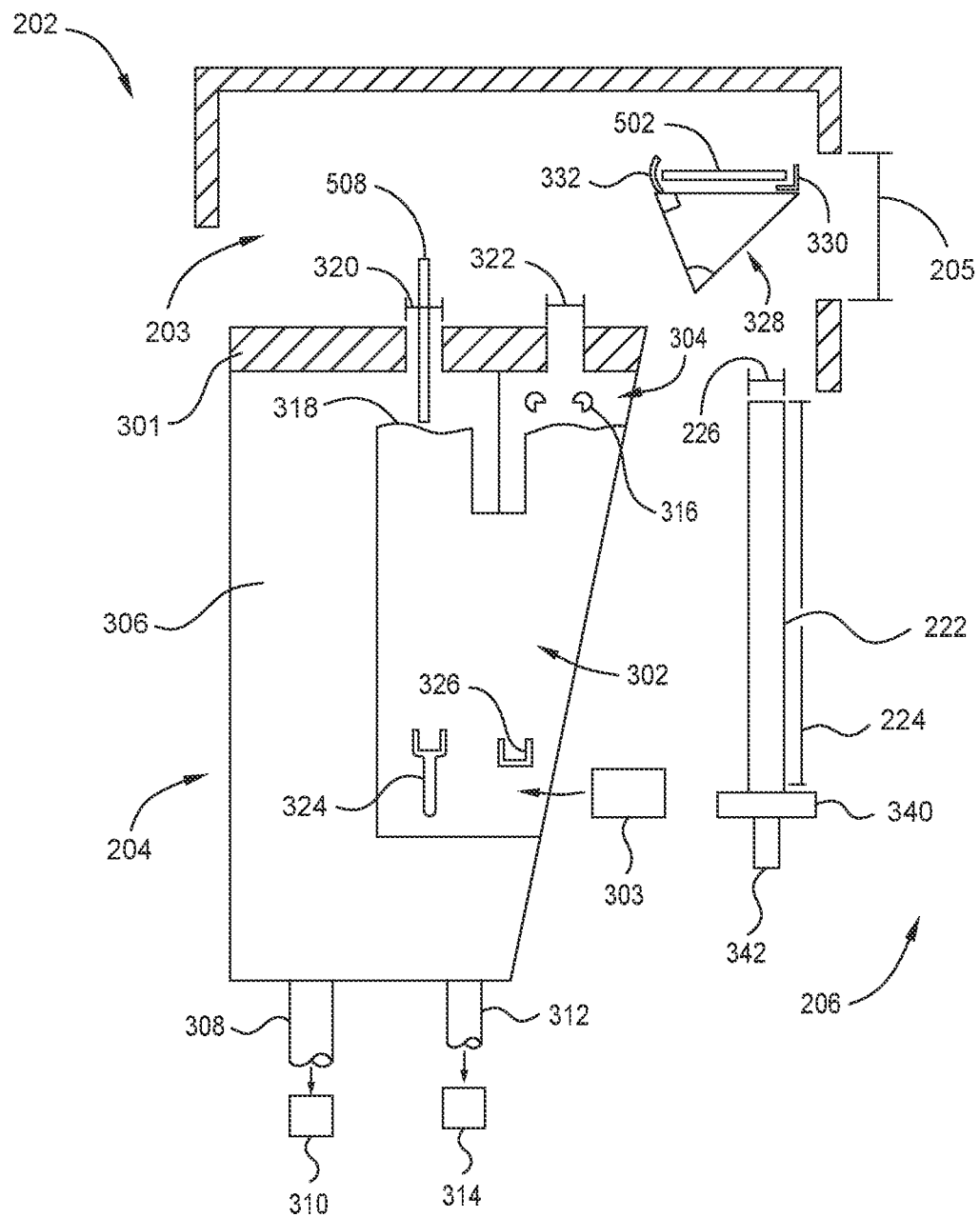

In block 410, the first substrate 502 is transferred to the factory interface 206 through the drying environment opening 205 while the sliding door 222 is in the position such that the entire length 224 of the sliding door 222 is below the drying environment opening 205, as shown in FIG. 5E. Simultaneously, a second substrate 508 is transferred into the dryer 204 through the first dryer opening 320. The sliding door 222 in block 410, like in block 402, is in the opened position such that drying environment 202 is exposed to the factory interface 206 through the drying environment opening 205. The opened position of the sliding door 222 allows the first substrate 502 to be transferred to the factory interface 206 by the rotation platform 328 through the drying environment opening 205. The rotation platform 328 rotates 90 degrees such that the first substrate 502 is in a horizontal orientation and can be loaded onto a transfer robot (not shown) within the factory interface 206. Additionally, the second substrate 508 enters the drying environment 202 as the first substrate 502 is exiting the drying environment 202, providing a process that can be repeated in a synchronous manner.

The method 400 advantageously provides a process such that the sliding door 222 is closed when a substrate is drying (such as the first substrate 502) but is opened when a substrate (such as the first substrate 502) is transferred to the factory interface 206 and another substrate (such as the second substrate 508) is simultaneously transferred to the drying environment 202. As such, these processes allow for multiple substrates to dry quickly and consistently within the process system 200, improving throughout and reducing costs.

While the foregoing is directed to implementations of the present invention, other and further implementations of the invention may be devised without departing from the basic scope thereof, and the scope thereof is determined by the claims that follow.

We claim:

1. A method for drying substrates, comprising:
transferring a first substrate into a dryer through a first dryer opening while a sliding door, having a length and a width, is positioned within a drying environment such that the entire length of the sliding door is below a drying environment opening, wherein the dryer is located within the drying environment and the drying environment opening is between the drying environment and a factory interface;
raising the sliding door to a position such that the length of the sliding door partially covers the drying environment opening while the first substrate is transferred to a position directly below a plurality of spray bars located within the dryer;
drying the first substrate by raising the first substrate past the plurality of spray bars and out of the dryer through a second dryer opening while the sliding door is in the position such that the entire length of the sliding door covers the drying environment opening;
lowering the sliding door to a position such that the length of the sliding door partially covers the drying environment opening while the first substrate is loaded onto a rotation platform within the drying environment; and
transferring the first substrate to the factory interface through the drying environment opening while the sliding door is in the position such that the entire length of the sliding door is below the drying environment opening and simultaneously transferring a second substrate into the dryer through the first dryer opening.

2. The method of claim 1, wherein the first substrate is transferred to the position directly below the plurality of spray bars by a pusher located within the dryer, wherein the pusher receives the first substrate from a cradle located within the dryer.

3. The method of claim 2, wherein the first substrate is loaded onto the rotation platform by a catcher configured to receive the first substrate from the pusher as the first substrate exits the dryer.

4. The method of claim 2, wherein the cradle is configured to receive the first substrate as the first substrate enters the dryer.

5. The method of claim 1, wherein the rotation platform further comprises a finger configured to secure the first substrate to the rotation platform.

6. The method of claim 1, wherein the plurality of spray bars are configured to spray the first substrate with an isopropyl alcohol (IPA) vapor.

7. The method of claim 1, wherein the sliding door is raised and lowered by an actuator mounted to a mounting arm, wherein the mounting arm is mounted to the sliding door.

8. The method of claim 1, wherein the drying environment further comprises a top portion that encloses a region that is located above the dryer within the drying environment, the top portion having the drying environment opening between the drying environment and the factory interface.

9. The method claim 8, wherein the sliding door is configured to move upwards to a position within the top portion.

10. The method of claim 1, wherein the dryer comprises a lid having the first dryer opening and the second dryer opening, wherein the lid is configured to receive the first substrate into the dryer through the first dryer opening and allow the first substrate to exit the dryer through the second dryer opening.

11. A method for drying substrates, comprising:
  transferring a substrate into a dryer through a first dryer opening while a sliding door, having a length and a width, is positioned within a drying environment such that the entire length of the sliding door is below a drying environment opening, wherein the dryer is located within the drying environment and the drying environment opening is between the drying environment and a factory interface;
  raising the sliding door to a position such that the length of the sliding door partially covers the drying environment opening;
  transferring the substrate to a position below a plurality of spray bars located within the dryer;
  raising the sliding door to a position such that the entire length of the sliding door covers the drying environment opening;
  drying the substrate by raising the substrate past the plurality of spray bars and out of the dryer through a second dryer opening;
  lowering the sliding door to a position such that the length of the sliding door partially covers the drying environment opening while the substrate is loaded onto a rotation platform within the drying environment;
  lowering the sliding door to a position such that the entire length of the sliding door is below the drying environment; and
  transferring the substrate to the factory interface through the drying environment.

12. The method of claim 11, wherein the substrate is transferred to the position below the plurality of spray bars by a pusher located within the dryer, wherein the pusher receives the substrate from a cradle located within the dryer.

13. The method of claim 12, wherein the substrate is loaded onto the rotation platform by a catcher configured to receive the substrate from the pusher as the first substrate exits the dryer.

14. The method of claim 12, wherein the cradle is configured to receive the substrate as substrate enters the dryer.

15. The method of claim 11, wherein the rotation platform further comprises a finger configured to secure the substrate to the rotation platform.

16. The method of claim 11, wherein the spraying the substrate with an isopropyl alcohol (IPA) vapor via the spray bars.

17. The method of claim 11, wherein the sliding door is raised and lowered by an actuator mounted to a mounting arm, wherein the mounting arm is mounted to the sliding door.

18. The method of claim 11, wherein the drying environment further comprises a top portion that encloses a region that is located above the dryer within the drying environment, the top portion having the drying environment opening between the drying environment and the factory interface.

19. The method of claim 18, wherein the sliding door is configured to move upwards to a position within the top portion.

20. The method of claim 11, wherein the dryer comprises a lid having the first dryer opening and the second dryer opening, wherein the lid is configured to receive the substrate into the dryer through the first dryer opening and allow the substrate to exit the dryer through the second dryer opening.

* * * * *